United States Patent [19]
Mahant-Shetti et al.

[11] Patent Number: 5,391,943
[45] Date of Patent: Feb. 21, 1995

[54] GATE ARRAY CELL WITH PREDEFINED CONNECTION PATTERNS

[76] Inventors: Shivaling S. Mahant-Shetti, 1405 Scottsboro La., Richardson, Tex. 75082; Robert J. Landers, 3228 Cross Bend, Plano, Tex. 75023

[21] Appl. No.: 178,712

[22] Filed: Jan. 10, 1994

[51] Int. Cl.[6] .......................................... H03K 19/017
[52] U.S. Cl. ............................. 326/41; 257/203; 326/121; 326/37; 326/50; 327/566
[58] Field of Search .................. 307/443, 451, 465, 469, 307/465.1, 303.2; 257/202–203, 208

[56] References Cited
U.S. PATENT DOCUMENTS

| | | | |
|---|---|---|---|
| 4,682,202 | 7/1987 | Tamizawa | 307/443 X |
| 4,727,266 | 2/1988 | Fujii et al. | 307/443 |
| 4,978,633 | 12/1990 | Seefeldt et al. | 257/203 X |

*Primary Examiner*—David R. Hudspeth
*Attorney, Agent, or Firm*—John D. Crane; Richard L. Donaldson

[57] ABSTRACT

A base cell for a CMOS gate array is provided with a plurality of N-channel transistors 10 and a plurality of P-channel transistors 12. These transistors are interconnected at the transistor level to form a partially prewired circuit. Additional N-channel (14) and P-channel (70, 72) transistors are included in the base cell at least some of which are larger in size than those in the plurality of N-channel transistors 10 or the plurality of P-channel transistors 12. These larger size transistors are used as output drivers to send the logical output signal of the cell to another cell.

33 Claims, 4 Drawing Sheets

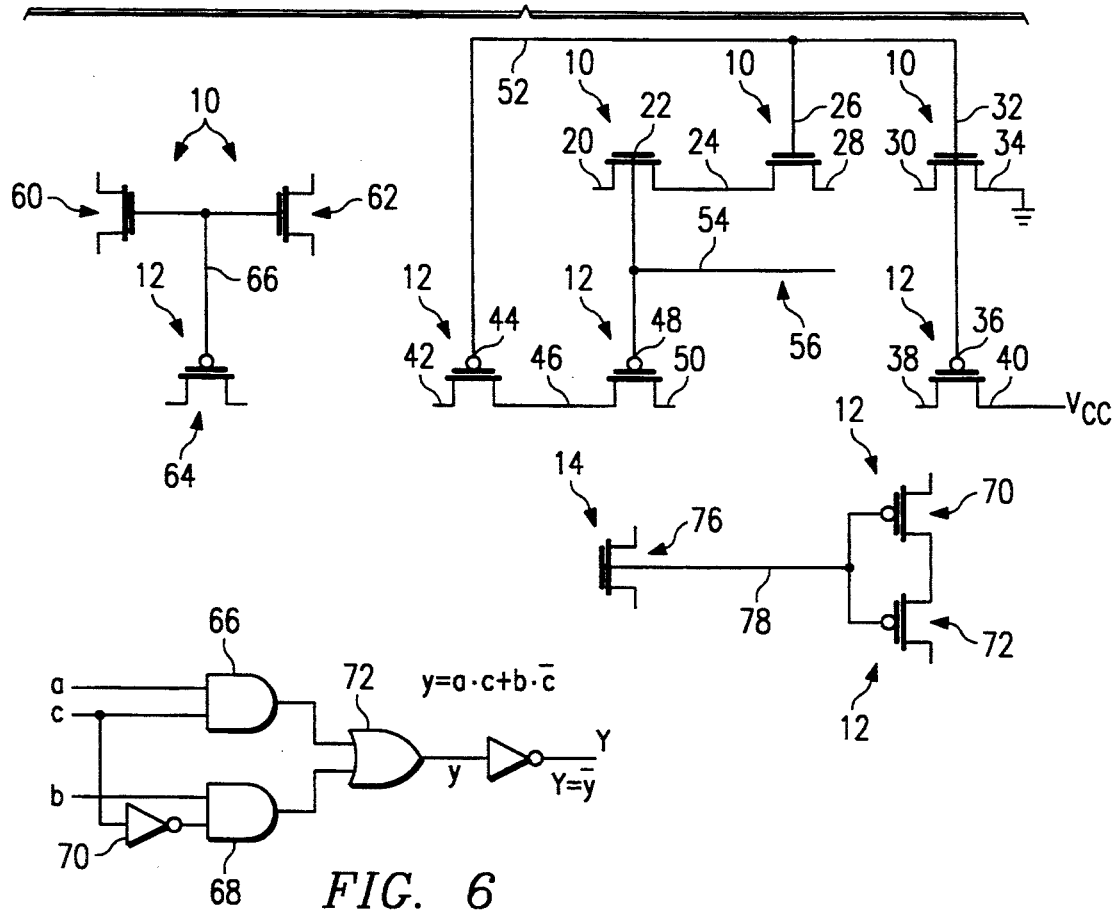
FIG. 1
FIG. 6
$y = a \cdot c + b \cdot \bar{c}$
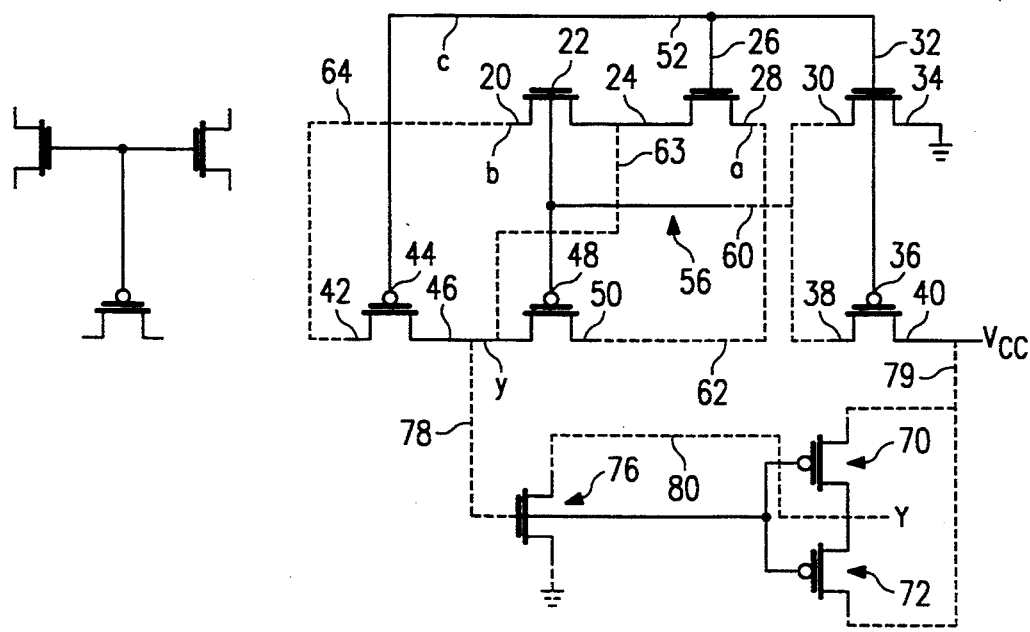
FIG. 5

GATE ARRAY CELL WITH PREDEFINED CONNECTION PATTERNS

FIELD OF THE INVENTION

This invention relates broadly to the field of gate arrays and particularly to a gate array having an architecture based on utilizing a cell having a plurality of partially prewired circuits as the principal building block for creating both simple and complex logic functions including the multiplexer function. The cell includes a separate plurality of transistors for line driving purposes.

BACKGROUND OF THE INVENTION

Traditional gate array base cells have evolved around efficient layout of transistor arrays. This has been due in part to the number of gates that can be formed in the array and in part due to the number of input/output pins the array has. As circuits have become smaller allowing more gates to be put on a single chip, it has been important to stress development of functions using programmable metal layers. This approach has been used in developing memory circuits, digital signal processing circuits, logic functions such as adders and the like and is based on having transistors available to form NAND gates, AOI cells, inverters, memory cells and the like.

The programmable metal used to produce the desired functions takes up a good deal of available space and has caused, especially in chips with very high integration, a reduction in the density of functions that can be formed. As a result, the typical wiring inefficiency for a given array has resulted in as many as 40% of the base cells on the chip not being utilized in the final circuit configuration. The inability to wire up desired functions in a single gate array, however, has increased the cost of utilizing this technology by increasing area required to perform a given function, thus wasting the components which could not be wired.

Another factor which has contributed to reduced efficiency in wiring gate array cells is the fact that the cells themselves have been frequently based on having the transistors available to form 2 input NAND circuits which has heretofore been thought to be quite flexible. However, an investigation of sequential logic functions and data signal processing functions has demonstrated that there is a high frequency of multiplexer circuits in such logic and that the multiplexer has proved to be somewhat difficult to implement in the numbers desired by designers because wiring routing channels are quickly used up.

SUMMARY OF THE INVENTION

The present invention is a CMOS array base cell which is designed to overcome the above mentioned and other problems with prior art base cells and utilizes a plurality of N-type and P-type transistors. At least two of the P-type transistors have their gates electrically connected to the gates of at least two N-type transistors. In addition, at least one other N-type transistor has its gate electrically connected to the gate of at least one P-type transistor. These interconnected transistors form the basic building blocks for the logic functions that can be implemented using the array cell.

In addition to the interconnected transistors, a pair of driver transistors are disposed inside the cell. The driver transistors are arranged with their gates coupled together. The driver transistors are of a physical size larger than the size of the other transistors in the base cell and preferably in the range of between 2 and 5 times the size of the other transistors in the cell. This larger size permits the driver transistors to be suitable for driving other circuits in the array. It also permits the other transistors in the cell to be smaller in size than is typically utilized in other array cells which increases the number of gates in the array and the speed of operation of those gates.

DESCRIPTION OF THE DRAWINGS

The above mentioned advantages and features of the present invention are described below in greater detail in connection with the drawings which form a part of the disclosure wherein;

FIG. 1 illustrates a schematic diagram of the base cell of the present invention;

FIG. 5 illustrates a circuit diagram showing how the elements of the base cell illustrated in FIG. 1 can be connected together to form a multiplexer circuit; and FIG. 6 illustrates the logic diagram for the base cell of FIG. 1 when wired as illustrated in FIGS. 4 and 5.

DETAILED DESCRIPTION

Figure 2:
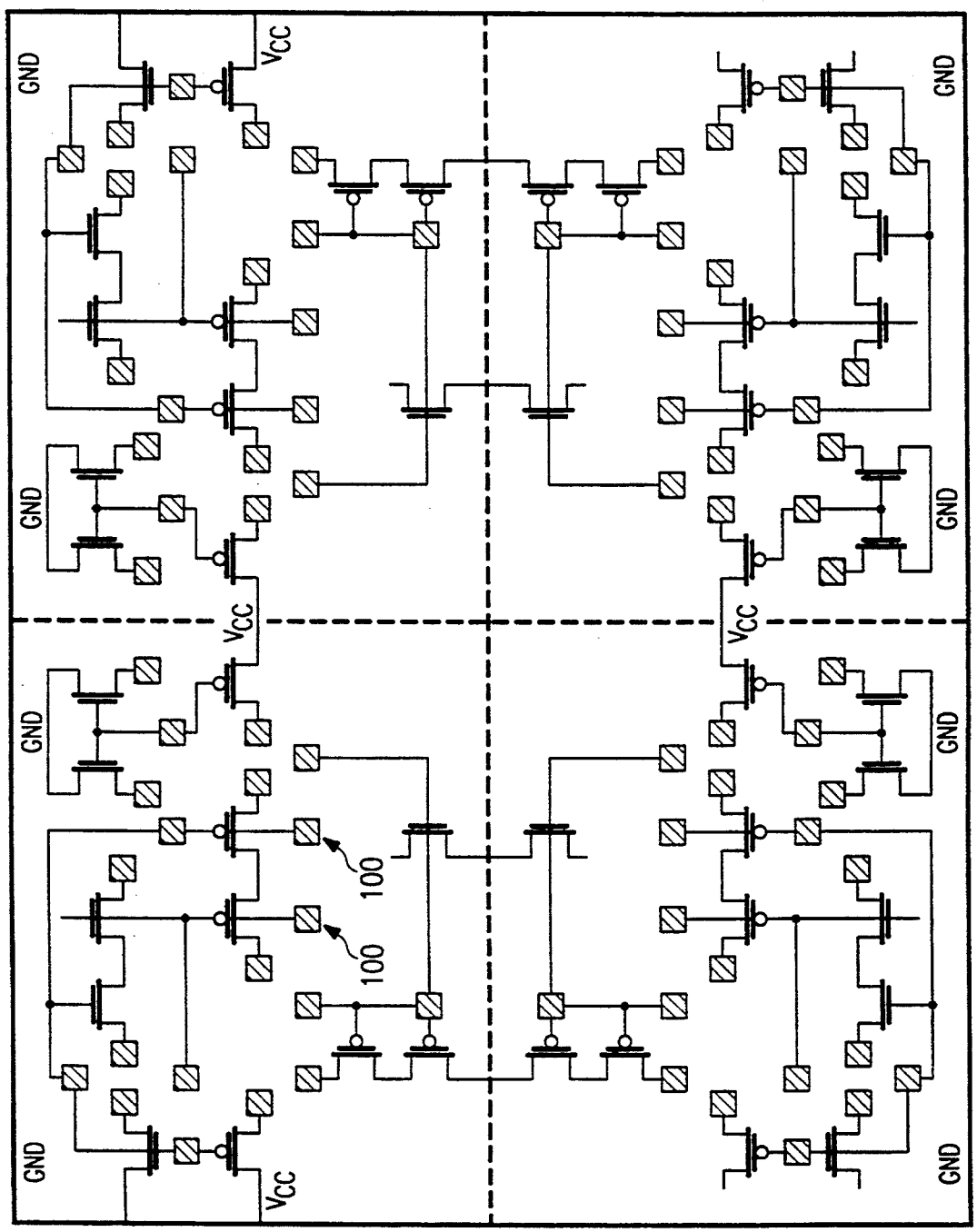
FIG. 2 illustrates how four base cells can be connected together along two different axes of symmetry.

Referring first to FIG. 1, a circuit diagram of the base cell of the present invention is illustrated. The circuit of FIG. 1 includes a plurality of N-channel transistors 10 physically located in a row and a plurality of P-channel transistors 12 located in a different row. A further N-channel transistor 14 is also included, however, this N-channel device is located in a different row from that of transistors 10. Further P-channel transistors 13 are also included, however, they are not located in the same row as the other p-channel transistors 12.

The first plurality of N-channel transistors 10 includes a first transistor having a source 24, gate 22 and drain 20 which is fabricated so as to electrically contact the source 24 of a second transistor having a gate 26 and a ! drain 28. A third N-channel transistor is provided with a source 34, gate 32 and drain 30. The source 34 is coupled to a contact pad for connection to ground.

A first plurality of P-channel transistors 12 are interconnected with polysilicon wiring at the transistor level to the first plurality of N-channel transistors 10. Specifically, a first P-channel transistor is provided having a source 46, gate 44 and drain 42. This transistor is coupled to a second P-channel transistor having a source 46, gate 48 and drain 50. There is a third P-channel transistor having a source 38, gate 36 and drain 40 which is coupled to a contact pad for connection to a voltage source $V_{cc}$.

The three above mentioned N-channel transistors and the three P-channel transistors are interconnected by polysilicon leads to form a partially prewired circuit. In particular, the gate 44, gate 26, gate 32 and gate 36 are coupled together by a polysilicon electrically conductive lead 52. The gates 22 and 48 are coupled together by a second polysilicon electrically conductive lead 54. This lead 54, as will become more clear from the later discussion of the drawings, has a tab portion indicated generally at 56 which extends away from the direct connection between the gate 48 and gate 22. This tab portion 56 is provided so as to permit easy first level wiring connection of the circuitry of FIG. 1 to form a multiplexer circuit.

The circuit of FIG. 1 additionally includes two N-channel transistors 60 and 62 which have their source and drain unconnected. A P-channel transistor 64 is also provided with its source and drain unconnected. However, the gate of transistors 60, 62 and 64 are electrically connected by a polysilicon lead 66. The configuration of the transistors 60, 62 and 64 is particularly advantageous for forming memory cells with the base cell illustrated in FIG. 1.

The base cell of FIG. 1 also includes two further P-channel transistors 70 and 72 which have their sources connected together while the drains thereof are left unconnected. A further N-channel transistor 76 is provided which has its source and drain unconnected. However, the gate of the transistor 76 is electrically connected by a polysilicon lead 78 to the gate of transistors 70 and 72.

Because of the geometry of the base cell illustrated in FIG. 1, this cell can be replicated in various inversions and mirror images so as to permit multiple base cells to be clustered together to further enhance the ability of the designer to produce complex functions utilizing the base cell of FIG. 1. For example, FIG. 2 illustrates how 4 base cells may be configured in a "quad" configuration. The shaded squares such as the two illustrated at 100 comprise contact pads which can be utilized by the system designer as contact points for configuring the base cell to a desired configuration.

Figure 3:
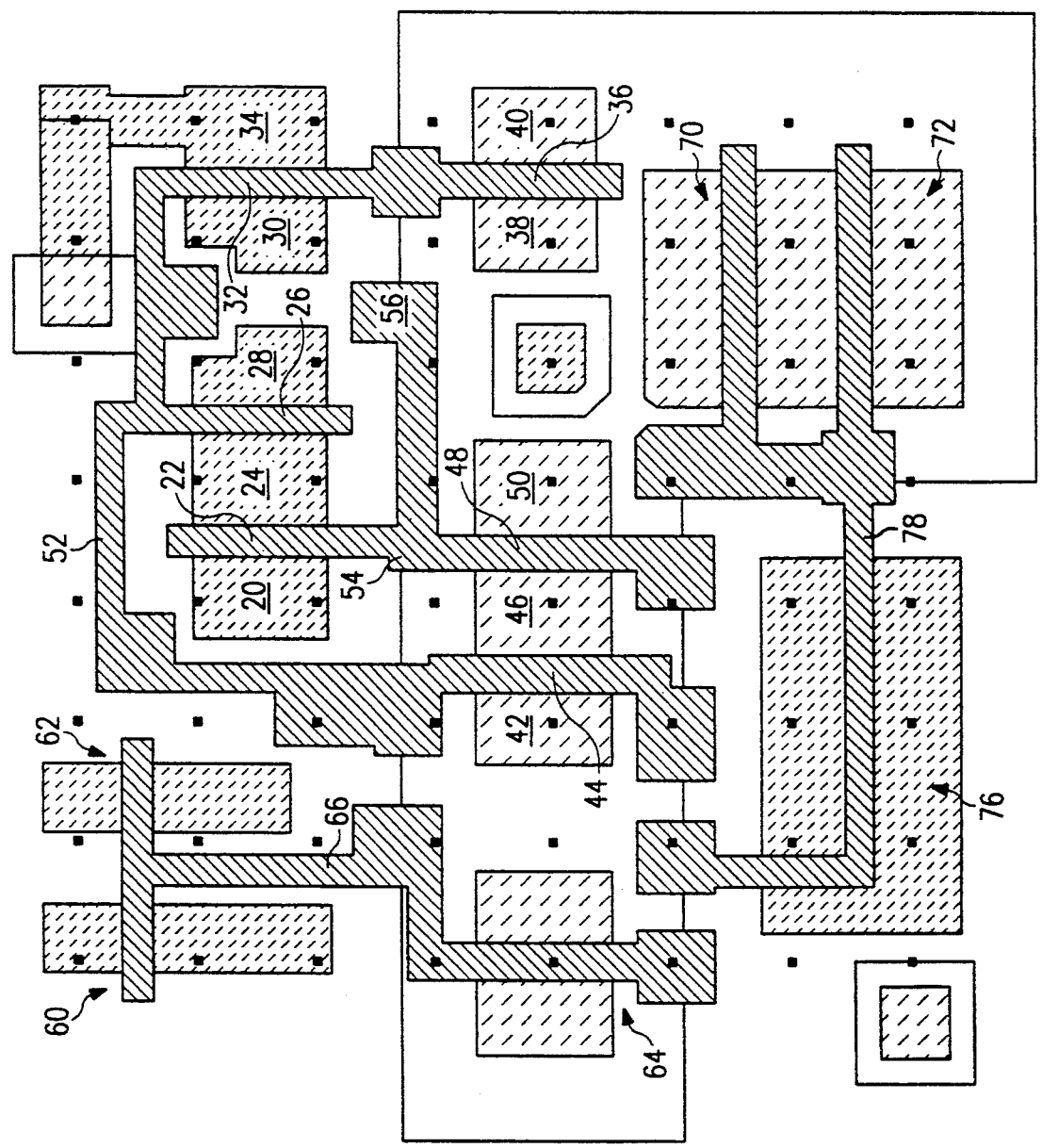
FIG. 3 illustrates the physical placement of the elements that comprise a base cell of the present invention.

Referring now to FIG. 3, the physical configuration for the base cell of FIG. 1 is illustrated. Each of the elements of FIG. 1 are shown in FIG. 3 so that the positioning thereof can be easily identified. Transistors 70, 72 and 76 are illustrated and have a physical area which is larger than the substantially identical sized N-channel and P-channel transistors disposed above them in FIG. 3. This is advantageous as transistors 70, 72 and 76 are used for driving other circuits outside of the base cell illustrated in FIG. 3. By making these transistors larger than the other transistors, the driver transistors 70, 72 and 76 are capable of driving more circuits at a longer distance than are the other transistors of FIG. 3. Indeed, it has been found that transistors 70, 72 and 76 should be in the range of between two and five times larger in channel width than the other transistors of the base cell. The exact extent to which transistors 70, 72 and 76 exceed the size of the other transistors of the base cell of FIG. 3 depends on the number of circuits that are intended to be driven thereby as well as the wiring distance between the transistors. This flexibility of design is important because it allows the designer to alter the physical layout of the base cell to permit selection the desired trade off between fan out and power considerations. Accordingly, the base cell design of the invention can be quickly and easily modified to meet varying market requirements.

Figure 4:
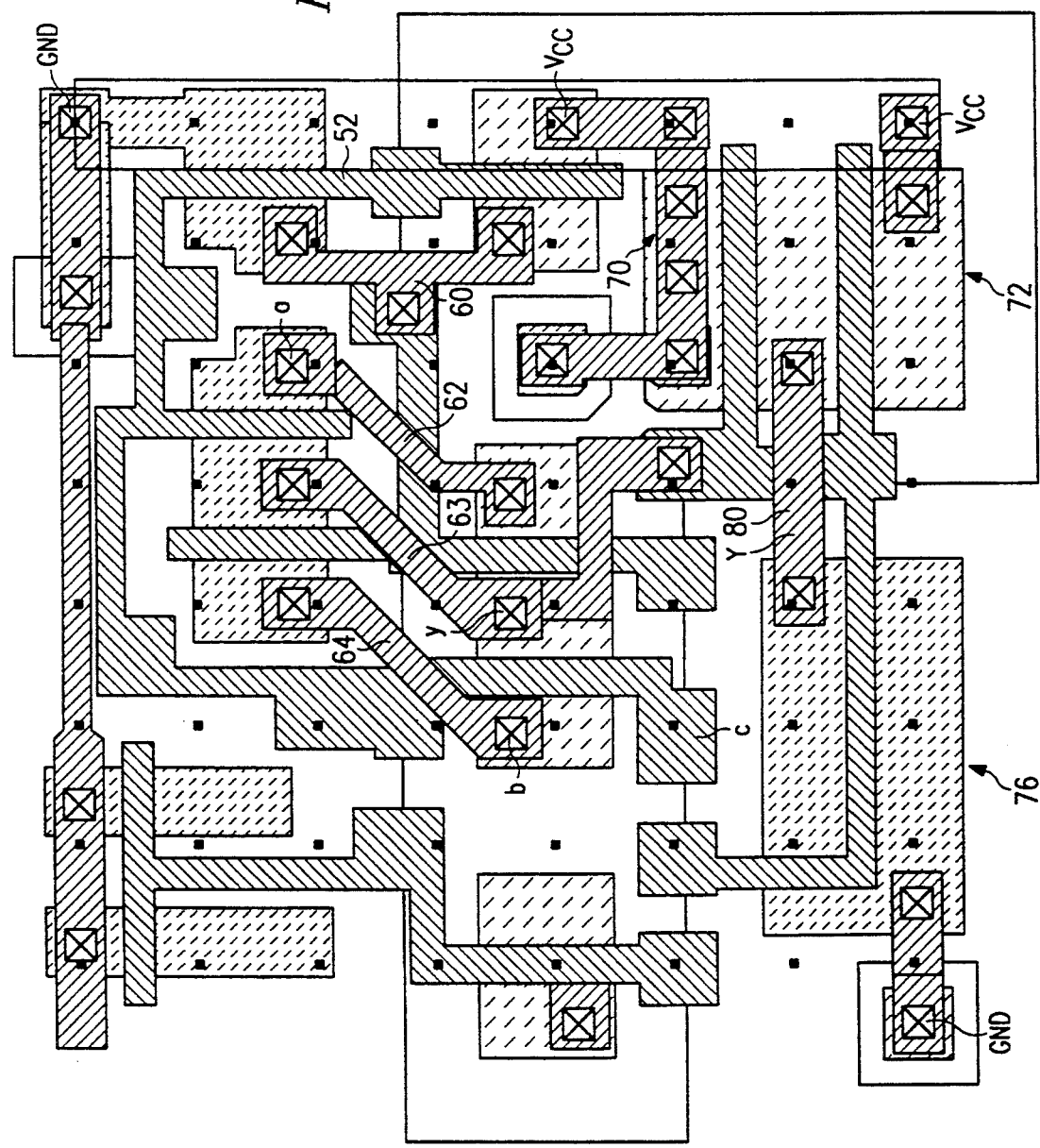
FIG. 4 illustrates the level one wiring required to configure the base cell of FIG. 3 to implement the multiplexer function of FIG. 5.

Referring now to FIG. 5, the first level wiring necessary to convert the base cell of FIG. 1 into a multiplexer circuit is illustrated. Comparable first level wiring is also illustrated in FIG. 4 which comprises the physical topology of the base cell configured as a multiplexer. In particular, first level wiring 60 is provided between the stub 56 the source 30 and the drain 38. The second first level wire 62 is provided between the drain 50 and the drain 28. A third first level wire 63 is provided between the source 24 and the source 46i. A fourth first level wiring 64 is provided between the source 20 and the source 42. This configuration corresponds to a portion of the logic diagram illustrated in FIG. 6 which comprises AND-gate 66, AND-gate 68, invertor 70 and OR gate 72. The inputs a, b, and c are shown in FIG. 5 and the output of the multiplexer is indicated at Y.

Since the physical size of the transistors utilized in producing the multiplexer function are smaller than the transistors 70, 72 and 76, the ability of the multiplexer to drive other circuits is, as indicated earlier, small. Accordingly, the transistors 70, 72 and 76 are configured to invert the output y and produce a inverted signal at Y which can be utilized to drive many other inputs. The invertor is configured by utilizing a first level wire 78 which couples between the output point Y and the gate of transistor 76. The transistor 76 has its drain coupled to ground and its source coupled to the connection point between the transistors 70 and 72. The source of the transistors 70 and 72 is coupled by a first level wire 79 to voltage source $V_{cc}$.

The forgoing discussion has discussed how the base cell of the present cell can be configured to form a multiplexer with an output driver capable of driving multiple circuits. It should be noted that the base cell can also be configured in a large number of other wiring patterns to produce different logical functions. Indeed, it can be shown that the configuration of FIG. 1 can produce the AND, or exclusive OR and invert functions which are functions that are required in order to produce other functions. Those of skill in the art will recognize that these four functions can be combined to produce any other desired function and, accordingly, the base cell of FIG. 1 is capable of being combined with other base cells wired in different ways to produce virtually any function desired by a system designer.

While the foregoing description has been made with particular emphasis on the embodiment of the invention as illustrated in the drawings, those of skill in the art will readily recognize that the invention may be modified in many ways without departing from the spirit and scope of the present invention. For example, if it were desired to make the N-channel transistors larger, the rectangular area occupied by the N-channel transistors could be enlarged by simply changing the topology of the base cell about the longitudinal axis of symmetry of this rectangular area, which axis extends through all the transistors 10, 62 and 60. In a similar fashion, the P-channel transistors 12 which lie in a second rectangular area below the rectangular area mentioned above could also be expanded about a second longitudinal axis of symmetry passing through all of the P-channel transistors 12 within the second rectangular area.

These and other changes in form only may be made without departing from the spirit and scope of the present invention as defined by the following claims.

What is claimed is:

1. A CMOS cell for use in a gate array comprising, in combination:
   a first plurality of n-channel transistors all of substantially the same physical size;
   a first plurality of p-channel transistors all substantially the same physical size as each said n-channel transistor, more than one said p-channel transistor being electrically interconnected with more than one said n-channel transistor to form partially prewired circuits than can later be finally configured utilizing programmable metal layers to meet design needs;

at least one additional n-channel transistor and at least one additional p-channel transistor, each said additional transistor being of a physical size larger than any one of said first plurality of n-channel transistors.

2. The CMOS cell of claim 1 wherein each said additional transistor is between about 2 and 5 times larger in physical size than any one of said first plurality of n-channel transistors.

3. The CMOS cell of claim 1 wherein said size corresponds to the channel width.

4. The CMOS cell of claim 2 wherein said size corresponds to the channel width.

5. The CMOS cell of claim 1 wherein each said transistor has a source, a drain and a gate, the gate of some of said plurality of n-channel transistors and the gate of some of said plurality of p-channel transistors being connected together.

6. The CMOS cell of claim 5 wherein the gate of all the remaining of said plurality of n-channel and said plurality of p-channel transistors are connected together.

7. The CMOS cell of claim 1 additionally including two further n-channel transistors and one further p-channel transistor each having a gate, the gate of said further transistors being connected together.

8. The CMOS cell of claim 1 wherein each said additional n-channel transistor and each said additional p-channel transistor has a gate connected together.

9. The CMOS cell of claim 5 wherein each said additional n-channel transistor and each said additional p-channel transistor has a gate connected together.

10. The CMOS cell of claim 1 wherein each said transistor has a source, a drain and a gate, the gate of some of said plurality of n-channel transistors and the gate of some of said plurality of p-channel transistors being electrically connected together with polysilicon.

11. The CMOS cell of claim 10 wherein the gate of all the remaining of said plurality of n-channel and said plurality of p-channel transistors are connected together with polysilicon.

12. The CMOS cell of claim 1 wherein each said transistor has a source, a drain and a gate, the gate of some of said plurality of n-channel transistors and the gate of some of said plurality of p-channel transistors being electrically connected together at the device level.

13. A CMOS cell for use in a gate array comprising, in combination:
a first plurality of n-channel transistors arranged along a first axis of symmetry;
a first plurality of p-channel transistors arranged along a second axis of symmetry;
the channel width of said plurality of n-channel transistors and the width of said plurality of p-channel transistors being independently selectable to achieve a desired power dissipation and fanout capability, more than one said p-channel transistor being electrically interconnected with more than one said n-channel transistor to form partially pre-wired circuits that can later be finally configured utilizing programmable metal layers to meet design needs;
at least one n-channel output transistor and at least one p-channel output transistor, said output transistors having a physical size which is larger than any one of said first or second plurality of transistors.

14. The CMOS cell of claim 13 wherein said size corresponds to the channel width.

15. The CMOS cell of claim 13 wherein said additional transistors each have a gate connected to the gate of another of said additional transistors.

16. The CMOS cell of claim 13 wherein each said transistor has a source, a drain and a gate, the gate of some of said plurality of n-channel transistors and the gate of some of said plurality of p-channel transistors being connected together.

17. The CMOS cell of claim 16 wherein said additional transistors each have a gate connected to the gate of another of said additional transistors.

18. The CMOS cell of claim 13 additionally including at least two additional n-channel transistors and at least one additional p-channel transistor, each said additional transistor including a gate, the gates of all said additional transistors being electrically connected together.

19. The CMOS cell of claim 16 additionally including at least two additional n-channel transistors and at least one additional p-channel transistor, each said additional transistor including a gate, the gates of all said additional transistors being electrically connected together.

20. A CMOS cell for use in a gate array comprising, in combination:
a first, second and third n-channel transistor each with a gate, a source and a drain;
a first, second and third p-channel transistor each with a gate, a source and a drain;
means to electrically interconnect the drains of said first and second n-channel transistors;
means to electrically interconnect the drains of said first and second p-channel transistors;
means to electrically interconnect the gate of said first n-channel transistor with the gate of said second p-channel transistor; and
means to electrically interconnect the gate of said first p-channel transistor, the gate of said second n-channel transistor, the gate of said third n-channel transistor and the gate of said third p-channel transistor.

21. The CMOS cell of claim 20 additionally including;
at least one additional n-channel transistor and at least one additional p-channel transistor, each with a gate; and
interconnection means interconnecting the gate of said additional p-channel transistors with the gate of said additional n-channel transistors.

22. The CMOS cell of claim 20 additionally including two further n-channel transistors and one further p-channel transistor each having a gate, the gate of said further transistors being connected together.

23. The CMOS cell of claim 21 additionally including two further n-channel transistors and one further p-channel transistor each having a gate, the gate of said further transistors being connected together.

24. The CMOS cell of claim 21 wherein each said additional transistor is between about 2 and 5 times larger in physical size than any one of said plurality of n-channel transistors and each of said plurality of p-channel transistors is substantially the same size as each of said plurality of n-channel transistors.

25. The CMOS cell of claim 21 wherein each said additional transistor is between about 2 and 5 times larger in physical size than any one of said plurality of n-channel transistors and each of said plurality of p-channel transistors is substantially the same size as each of said plurality of n-channel transistors.

26. The CMOS cell of claim 22 wherein each said additional transistor is between about 2 and 5 times larger in physical size than any one of said plurality of n-channel transistors and each of said plurality of p-channel transistors is substantially the same size as each of said plurality of n-channel transistors.

27. The CMOS cell of claim 23 wherein each said additional transistor is between about 2 and 5 times larger in physical size than any one of said plurality of n-channel transistors and each of said plurality of p-channel transistors is substantially the same size as each of said plurality of n-channel transistors.

28. The CMOS cell of claim 20 wherein each said means to electrically interconnect comprises a conductive material selected from the group comprising conductive metals and polysilicon.

29. The CMOS cell of claim 21 wherein each said additional transistor is larger in physical size than any one of said plurality of n-channel transistors and each of said plurality of p-channel transistors is substantially the same size as each of said plurality of n-channel transistors.

30. A CMOS cell for use in a gate array comprising, in combination:
a plurality of n-channel transistors disposed in a first generally rectangular area, the longitudinal axis of said first rectangular area providing a symmetry axis about which the width of said n-channel transistors can be modified to meet circuit design criteria;
a plurality of p-channel transistors disposed in a second generally rectangular area, the longitudinal axis of said second rectangular area providing a symmetry axis about which the width of said p-channel transistors can be modified to meet circuit design criteria;
at least one additional p-channel transistor and at least one additional n-channel transistor disposed in a third generally rectangular area, said additional transistors having a size greater than said n-channel transistors;
each said transistor having a gate, a source and a drain;
means electrically connecting the gate of two of said plurality-of n-channel transistors with the gate of two of said plurality of p-channel transistors;
means electrically connecting the gate of one of said plurality of n-channel transistors with the gate of one of said p-channel transistors; and
means to electrically connect the gate of said additional n-channel transistor with the gate of said additional p-channel transistor.

31. The CMOS cell of claim 30 additionally including;
means to electrically connect the gate of two of said plurality of n-channel transistors with the gate of one of said plurality of p-channel transistors.

32. The CMOS cell of claim 30 wherein the width of each said additional transistor is between 2 and 5 times the width of one of said plurality of n-channel transistors.

33. The CMOS cell of claim 30 additionally including a further CMOS cell of the type defined by claim 26 having a mirrored configuration which is disposed adjacent the cell of claim 26.

* * * * *